(12) United States Patent
Oh et al.

(10) Patent No.: US 11,381,246 B2
(45) Date of Patent: Jul. 5, 2022

(54) TIME-TO-DIGITAL CONVERTER AND CONVERTING METHODS

(71) Applicant: HYUNDAI MOBIS CO., LTD., Seoul (KR)

(72) Inventors: Jung Dae Oh, Gwangju-si (KR); Hee Hyun Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 48 days.

(21) Appl. No.: 17/110,010

(22) Filed: Dec. 2, 2020

(65) Prior Publication Data
US 2021/0184684 A1 Jun. 17, 2021

(30) Foreign Application Priority Data
Dec. 17, 2019 (KR) .......................... 10-2019-0168716

(51) Int. Cl.
*H03L 7/081* (2006.01)
*H03M 1/06* (2006.01)
*G04F 10/00* (2006.01)
*G01S 7/4865* (2020.01)
*G01S 17/14* (2020.01)

(52) U.S. Cl.
CPC .......... *H03L 7/0818* (2013.01); *G01S 7/4865* (2013.01); *G01S 17/14* (2020.01); *G04F 10/005* (2013.01); *H03M 1/0604* (2013.01)

(58) Field of Classification Search
CPC ............................ G04F 10/005; H03L 7/0818
USPC ....................................................... 327/149
See application file for complete search history.

(56) References Cited

U.S. PATENT DOCUMENTS 9,379,714 B1 * 6/2016 Xiu ........................ G01S 7/4865
10,108,148 B1 * 10/2018 Testi ...................... G04F 10/005
10,340,925 B1 7/2019 Mostafa et al.
(Continued)

FOREIGN PATENT DOCUMENTS

KR  10-2012-0022470 A  3/2012
KR  10-2014-0115263 A  9/2014
(Continued)

OTHER PUBLICATIONS

Notice of Allowance issued in corresponding Korean Patent Application No. 10-2019-0168716 dated Oct. 5, 2021, with English translation.

*Primary Examiner* — Adam D Houston
(74) *Attorney, Agent, or Firm* — Morgan, Lewis & Bockius LLP

(57) ABSTRACT

A time-to-digital converter and a converting method are provided. The time-to-digital converter includes: a phase locked loop unit configured to multiply an input reference clock by using a phase locked loop (PLL); a counting unit configured to count the multiplied input reference clock and record an edge position of an input signal; a delay locked loop unit configured to decompose the multiplied input reference clock into a multi-phase clock using a delay locked loop (DLL), and sense the recorded edge position of the input signal among the decomposed multi-phase clock and record a fine edge position; and a control unit configured to calculate a time difference in time of flight (ToF) between a start signal and a stop signal of the input signal by using the recorded edge position and the recorded fine edge position.

13 Claims, 13 Drawing Sheets

(56) References Cited

U.S. PATENT DOCUMENTS

| | | | |
|---|---|---|---|
| 10,419,007 B2* | 9/2019 | Gao | H03L 7/0802 |
| 10,498,344 B2* | 12/2019 | Janardhanan | H03L 7/148 |
| 10,715,154 B2* | 7/2020 | Xiu | H03L 7/087 |
| 10,826,514 B1* | 11/2020 | Honarparvar | H03K 3/0315 |
| 11,079,723 B2* | 8/2021 | Chu | H03K 5/159 |
| 2016/0238998 A1* | 8/2016 | Pavlovic | H03C 3/0941 |
| 2016/0241301 A1* | 8/2016 | Pavlovic | H03C 3/0933 |
| 2017/0299721 A1* | 10/2017 | Eichenholz | H01S 3/06733 |
| 2019/0033431 A1* | 1/2019 | Haneda | G04F 10/005 |
| 2019/0305784 A1* | 10/2019 | Ronchini Ximenes | H03L 7/0995 |
| 2020/0142038 A1* | 5/2020 | Han | G01S 17/42 |
| 2020/0212916 A1* | 7/2020 | Moe | H03K 3/0315 |
| 2021/0184684 A1* | 6/2021 | Oh | H03M 1/0604 |
| 2021/0247502 A1* | 8/2021 | Kim | G01S 7/4863 |
| 2021/0255285 A1* | 8/2021 | Buckley | G01S 17/14 |
| 2021/0288653 A1* | 9/2021 | Liang | H03L 7/089 |

FOREIGN PATENT DOCUMENTS

| | | | | |
|---|---|---|---|---|
| KR | 2015-0145360 A | | 12/2015 | |
| KR | 10-2018-0013261 A | | 2/2018 | |
| KR | 10-2018-0064969 A | | 6/2018 | |
| KR | 10-2019-0048135 A | | 5/2019 | |
| KR | 20210077267 A | * | 6/2021 | |
| WO | WO-2018028795 A1 | * | 2/2018 | G01S 13/222 |

\* cited by examiner

TIME-TO-DIGITAL CONVERTER AND CONVERTING METHODS

CROSS-REFERENCE TO RELATED APPLICATION

This application claims priority to and the benefit of Korean Patent Application No. 10-2019-0168716 filed on Dec. 17, 2019, the entire contents of which are incorporated herein by reference.

TECHNICAL FIELD

The present disclosure relates to a time-to-digital converter and converting methods, and for example, to a time-to-digital converter and converting methods which may be used in a LIDAR system.

BACKGROUND

Light detection and ranging (LIDAR) is a technology that detects an object and measures a distance by using light. The LIDAR represents measuring physical properties including a distance and concentration, a speed, a shape, and the like of an object to be measured from a time from radiation of a laser up to return of a scattered or reflected laser and an intensity of the laser, a change in frequency, a change in polarization state, etc.

The LIDAR is similar to radio detection and ranging (RADAR) that acquires the distance by observing a reciprocating time up to a target by using a microwave, but is different from the RADAR in that the LIDAR uses the light unlike the RADAR using radio waves and in this respect, the LIDAR is also referred to as an 'image radar'.

A time-to-digital converter (TDC) used in the LIDAR system is a device that recognizes an event or provides a digital expression of a time when the event occurs, or measures a time interval between two events.

The conventional time-to-digital converter has a Vernier inverter structure. In the Vernier inverter structure, inverters are connected in series and delay accuracy per inverter means temporal resolution. The conventional time-to-digital converter determines a difference in delay at a rising edge of a start signal and a stop signal. After the rising edge at the time of the start signal, an internal counter value of a time when an object returns is active at the time of the stop signal, and the number of counters from the start signal to the stop signal is converted into an actual distance. As described above, a serial inverter chain becomes the resolution.

Referring to a problem in a conventional scheme, the conventional time-to-digital converter is used only with a single channel. Further, the conventional time-to-digital converter has a high dependence on an inverter delay. The conventional time-to-digital converter has a narrow detectable time range. A count value from the time of the start signal up to the time of the stop signal means a measurable distance. Since the conventional time-to-digital converter is dependent on a change in external environment, it is difficult to have a stable high resolution.

As such, since the conventional time-to-digital converter used in the LIDAR system is used only with a single channel, has the high dependence on the inverter delay, has the narrow detectable time range, and is dependent on the change in external environment, the conventional time-to-digital converter has a problem that it is difficult for the conventional time-to-digital converter to have a stable high resolution.

SUMMARY

Exemplary embodiments of the present disclosure provide a time-to-digital converter and converting methods, which output a time difference between a start signal and a stop signal input by using both a phase locked loop and a delay locked loop as a digital value to precisely measure a distance.

However, it is to be understood that the technical problem to be solved by the present disclosure is not limited to the above problems and may be variously extended in an environment of a range which does not depart from the spirit and area of the present disclosure.

An exemplary embodiment of the present disclosure provides a time-to-digital converter including: a phase locked loop unit multiplying an input reference clock by using a phase locked loop (PLL); a counting unit counting the multiplied reference clock and recording an edge position of an input signal; a delay locked loop unit decomposing the multiplied reference clock into a multi-phase clock using a delay locked loop (DLL), and sensing a recorded edge position part of the input signal among the decomposed multi-phase clocks and recording a fine edge position; and a control unit calculating a time difference in time of flight (ToF) between a start signal and a stop signal of the input signal by using the recorded edge position and the recorded fine edge position.

The edge position and the fine edge position may be recorded for each of a rising edge and a falling edge of the input signal.

The delay locked loop unit may include a first delay locked loop unit decomposing the multiplied reference clock into a first multi-phase clock by using a first delay locked loop, and a second delay locked loop unit decomposing the decomposed first multi-phase clock into a second multi-phase clock by using a second delay locked loop.

In an exemplary embodiment, the delay locked loop unit may sense the edge position part of the recorded input signal among the decomposed multi-phase clocks and record a first fine edge position and sense the recorded first fine edge position part among the decomposed second multi-phase clocks and record a second fine edge position.

When the input signal is configured by a multi-channel input signal, the control unit may expand a channel of the stop signal of the input signal.

The control unit may check a signal intensity of the input signal, distinguish a target object by using the checked signal intensity, and correct a distance error from the target object by using the checked signal intensity.

When light transmitted to the target object is reflected by a subject, the control unit may remove noise information corresponding to the reflected light by using pulse width and transition time information.

Another exemplary embodiment of the present disclosure provides a time-to-digital converting method in a LIDAR system, including: decomposing the multiplied reference clock into multi-phase clocks by using a delay locked loop (DLL); counting the multiplied reference clock and recording an edge position of an input signal; sensing the edge position part of the input signal among the decomposed multi-phase clocks and recording a fine edge position; and calculating a time difference in time of flight (ToF) between a start signal and a stop signal of the input signal by using the edge position and the fine edge position.

The edge position and the fine edge position may be recorded for each of a rising edge and a falling edge of the input signal.

In an exemplary embodiment, the recording of the fine edge position may include decomposing the multiplied reference clock into a first multi-phase clock by using a first delay locked loop, and decomposing the decomposed first multi-phase clock into a second multi-phase clock by using a second delay locked loop.

In an exemplary embodiment, in the recording of the fine edge position, the edge position part of the recorded input signal may be sensed among the decomposed multi-phase clocks and a first fine edge position may be recorded and the recorded first fine edge position part may be sensed among the decomposed second multi-phase clocks and a second fine edge position may be recorded.

In the calculating the difference in time of flight, a signal intensity of the input signal may be checked, a target object may be distinguished by using the checked signal intensity, and a distance error from the target object may be corrected by using the checked signal intensity.

In the calculating the difference in time of flight, when light transmitted to the target object is reflected by a subject, noise information corresponding to the reflected light may be removed by using pulse width and transition time information.

The disclosed technology may have the following effects. However, since it is not meant that a particular embodiment should include all of the following effects or merely include the following effects, the scope of the disclosed technology is not to be construed as being limited thereby.

According to exemplary embodiments of the present disclosure, a high-resolution time-to-digital converter can be designed using multiple phases.

According to exemplary embodiments of the present disclosure, it is possible to show robust characteristics to an external environment by using a phase locked loop and a delay locked loop as a feedback system. For example, the external environment may include changes in temperature and power voltage, a change in manufacturing process, and the like.

According to exemplary embodiments of the present disclosure, it is easy to expand a channel using a small area by using the delay locked loop as a channel configuration.

According to exemplary embodiments of the present disclosure, it is possible to enhance a detection capability for a signal at a long distance with the same resolution by using a counter.

According to exemplary embodiments of the present disclosure, precision can be increased by sensing both a rising edge and a falling edge of a pulse.

The foregoing summary is illustrative only and is not intended to be in any way limiting. In addition to the illustrative aspects, embodiments, and features described above, further aspects, embodiments, and features will become apparent by reference to the drawings and the following detailed description.

DRAWINGS

Figure 1:
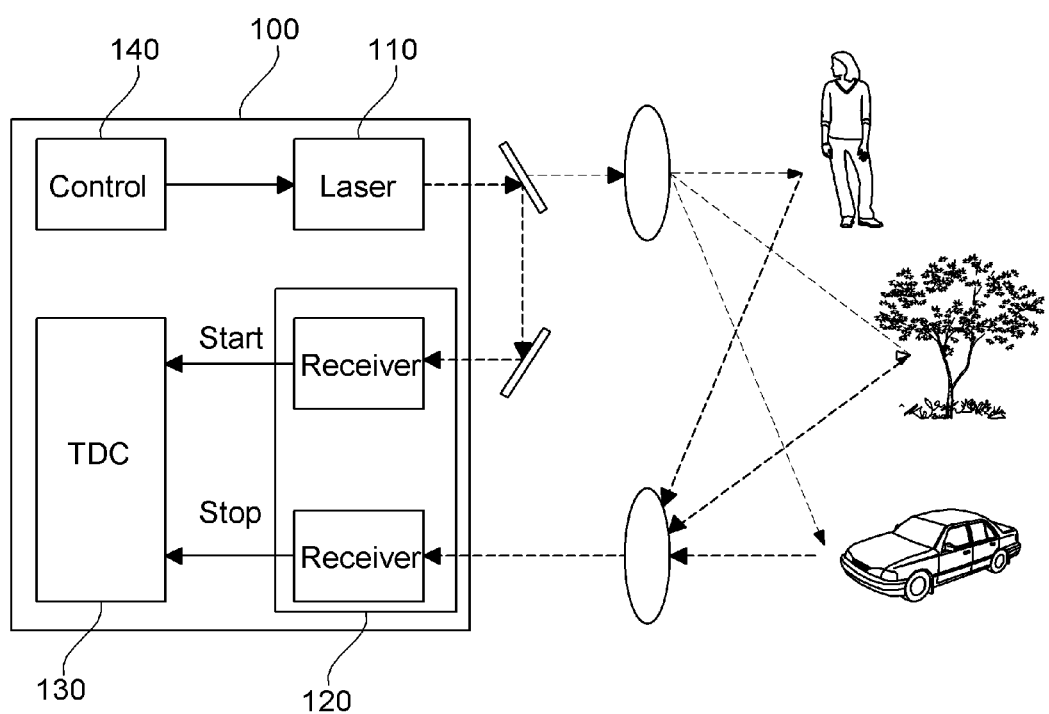
FIG. 1 is a diagram illustrating a configuration of a LIDAR system in one form of the present disclosure.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

The present disclosure may have various modifications and various exemplary embodiments and specific exemplary embodiments will be illustrated in the drawings and described in detail.

However, this does not limit the present disclosure to specific exemplary embodiments, and it should be understood that the present disclosure covers all the modifications, equivalents and replacements included within the idea and technical scope of the present disclosure.

Terms including as first, second, and the like are used for describing various components, but the components should not be limited by the terms. The terms are used only to discriminate one component from another component. For example, a first component may be referred to as a second component, and similarly, the second component may be referred to as the first component without departing from the scope of the present disclosure. A term 'and/or' includes a combination of a plurality of associated disclosed items or any item of the plurality of associated disclosed items.

It should be understood that, when it is described that a component is "connected to" or "accesses" another component, the component may be directly connected to or access the other component or a third component may be present therebetween. In contrast, it should be understood that, when it is described that a component is "directly connected to" or "directly accesses" another component, it is understood that no element is present between the element and another element.

Terms used in the present application are used only to describe specific exemplary embodiments, and are not intended to limit the present disclosure. A singular form may include a plural form if there is no clearly opposite meaning in the context. In the present application, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

If not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

Hereinafter, preferred embodiments of the present disclosure will be described in more detail with reference to the accompanying drawings. In describing the present disclosure, the same reference numerals are used for the same components in the drawings and a duplicated description of the same components will be omitted for facilitating overall understanding of the present disclosure.

FIG. 1 is a diagram illustrating a configuration of a LIDAR system in some forms of the present disclosure.

A LIDAR system in some forms of the present disclosure uses a LIDAR sensor technology used to detect front and rear objects of a vehicle. The LIDAR system uses a technology that senses a time during which light is reflected on an object and returned by using the light to detect a distance.

In a vehicle field, the LIDAR system is used for the purpose of calculating the distance to the object, and converts a signal of the light into an electric signal to recognize a beginning and an end, and calculates a time difference to recognize the distance. Since a speed of the light is equal to the speed of a radio wave, the time during which the light is reflected on the object and returned is divided by half and multiplied by the speed of the light to become the distance.

As illustrated in FIG. 1, the LIDAR system 100 may be divided into a transmission unit 110 receiving an electric signal and emitting light, a reception unit 120 receiving the light and emitting the electric signal, a time-to-digital conversion unit 130 receiving the electric signal as an input and converting the time into a digital value, and an MCU unit 140 overseeing an entire system.

An exemplary embodiment of the present disclosure relates to a time-to-digital converter used in the LIDAR system. The time-to-digital converter is a circuit that calculates a time difference of the electric signal and outputs the calculated time difference as the digital value. The output digital value is time difference information, and when the digital value is calculated as a speed of a radio wave, the digital value may be converted into distance information. An exemplary embodiment of the present disclosure has been made in an effort to provide a time-to-digital converter of a distance measurement LIDAR capable of precisely measuring a distance.

Figure 2:
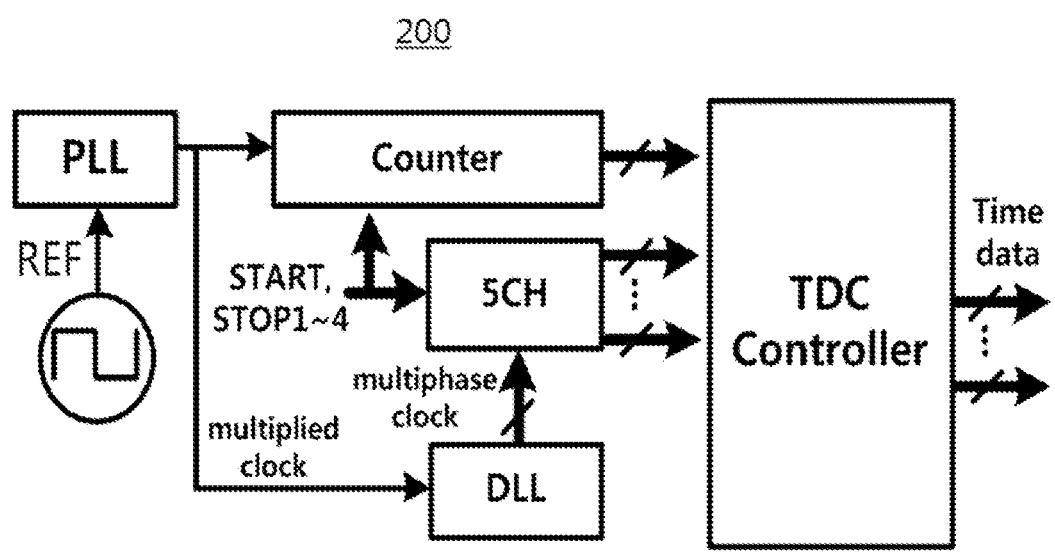
FIG. 2 is a diagram illustrating an operating principle of a time-to-digital converter in a LIDAR system in one form of the present disclosure.

FIG. 2 is a diagram illustrating an operating principle of a time-to-digital converter in a LIDAR system in some forms of the present disclosure.

As a means for solving the problem of the related art, an exemplary embodiment of the present disclosure has been made in an effort to enable stable and precise distance information detection against a change in external environment. A time-to-digital converter 200 according to an exemplary embodiment of the present disclosure uses a phase locked loop (PLL) and a delay locked loop (DLL) to generate a clock signal which produces a stable output against an influence of the external environment. In addition, the time-to-digital converter 200 may detect a long distance by using a counter and make precision of high resolution equal using multi-phases. Here, since the phase locked loop and the delay locked loop include a feedback circuit, the stable output may be produced in external environments such as process change, temperature, and voltage.

Technical features of the present disclosure will be described. It is important that the time-to-digital converter 200 precisely analyzes the difference between the electric signals and produces the output with high resolution. As an example, if the number of bits for a time of approximately 100 ps may be expressed, a resolution of 1.5 cm may be achieved.

The time-to-digital converter 200 of the LIDAR system must be able to process time information of multiple channels in a short time, and requires high resolution performance with high resolution. Operations and features in some forms of the present disclosure are as follows.

The time-to-digital converter 200 multiplies a frequency by using the phase locked loop (PLL) receiving a reference frequency as the input.

In addition, the time-to-digital converter 200 decomposes the multiplied clock into the multi-phases using the delay locked loop (DLL).

The time-to-digital converter 200 counts with the multiplied clock and stores a coarse code at an edge of an input signal.

The time-to-digital converter 200 senses a portion of the multi-phases where the edge of the input signal is located and stores the sensed portion in a fine code.

The time-to-digital converter 200 calculates the time difference by storing both a start signal and a stop signal.

The time-to-digital converter 200 may configure a system by expanding a channel of the stop signal when configuring the multi-channels.

The operating principle of the time-to-digital converter 200 in some forms of the present disclosure will be described in detail.

The time-to-digital converter 200 multiplies the frequency by using the phase locked loop (PLL) receiving the reference frequency as the input. Here, the time-to-digital converter 200 generates a high frequency to increase an overall resolution, and adjusts a duty ratio to consider both rising and falling edges.

The time-to-digital converter 200 decomposes the multiplied clock into the multi-phases using the delay locked loop (DLL). The time-to-digital converter 200 divides a level of the resolution into two parts, coarse and fine, to form a phase.

Thereafter, the time-to-digital converter 200 performs counting with the multiplied clock and stores the coarse code at the edge of the input signal. Here, the rising and falling edges are stored separately.

In addition, the time-to-digital converter 200 senses a portion of the multi-phases where the edge of the input signal is located and stores the sensed portion in the fine code. Here, the rising and falling edges are stored separately.

The time-to-digital converter 200 calculates the time difference by storing both the start signal and the stop signal. Here, when a ToF value measured by the rising edge and a ToF value measured by the falling edge are compared and determined to be a valid signal, the value is applied. On the contrary, when the resolution exceeds a specified value or is abnormal, information is delivered to a user. Further, since an internal system knows the resolution of the coarse part/fine part, the time-to-digital converter 200 may indirectly know in which portion an error occurs. The time-to-digital converter 200 may accumulate the value and use a value of a signal entering at the corresponding timing for correction afterwards.

Meanwhile, the system may be configured by expanding a channel of a stop at the time of configuring the multi-channels.

Figure 3:
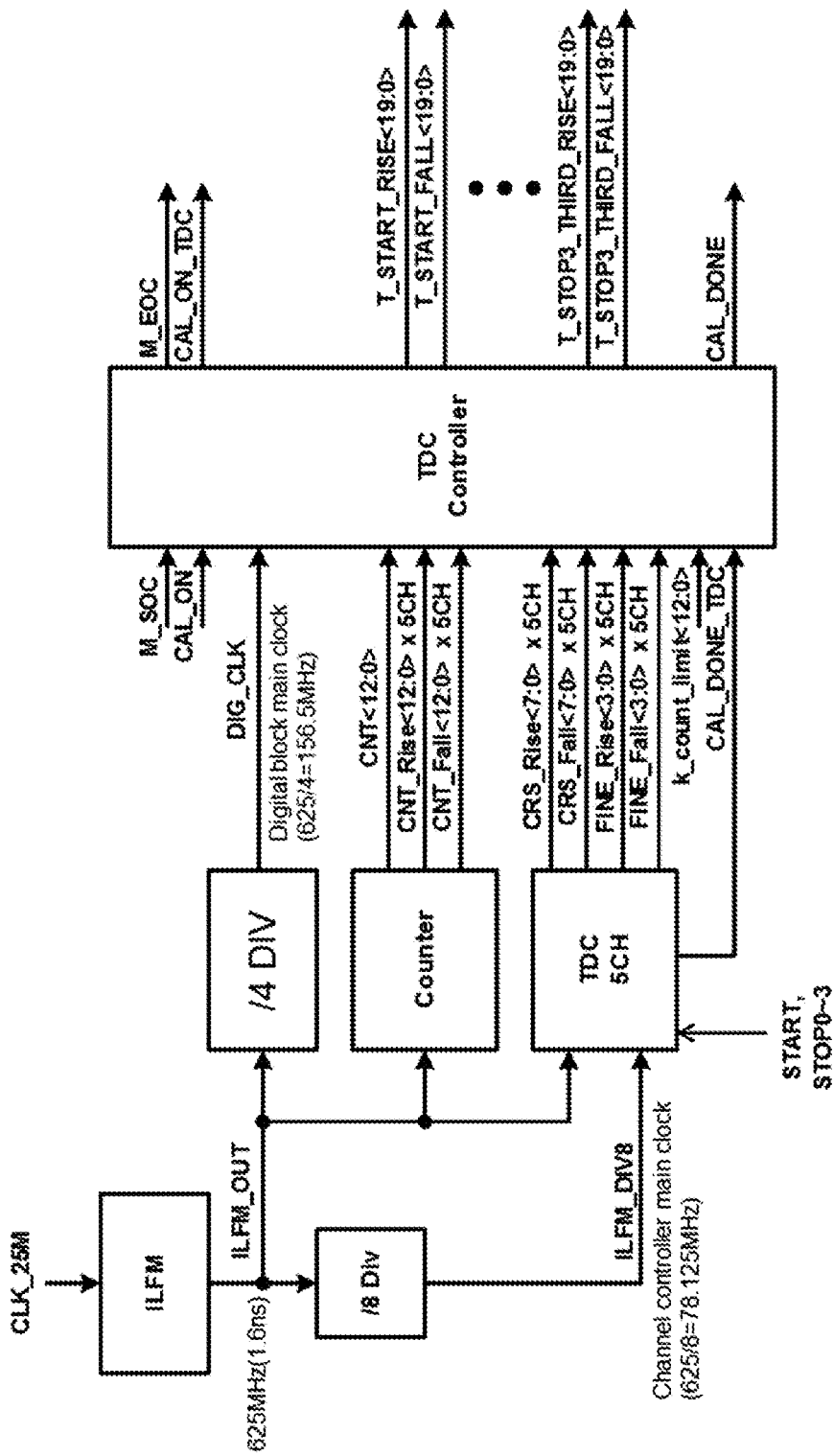
FIG. 3 is a diagram illustrating a detailed block configuration of a time-to-digital converter in a LIDAR system in one form of the present disclosure.

FIG. 3 is a diagram illustrating a detailed block configuration of a time-to-digital converter in a LIDAR system in some forms of the present disclosure.

CLK_25M represents ILFM REFCLK from TCXO.

Injection Locked Frequency Multiplier (ILFM) represents PLL. An output frequency (Out Frequency) becomes 25 MHz×25=625 MHz.

A counter counts ILFM_out (Coarse code, 13 bits).

A middle code and a fine code generated by ADDLL are stored in TDC 1CH. Here, Middle is 8 bits and Fine is 4 bits, which are stored for the rising and falling edges, respectively.

The start signal is a start signal from PreDriver.

The stop signal 0 to 3 is a stop signal from TIA.

A TDC controller synthesizes a TDC output code and generates a TDC control signal.

Figure 4:
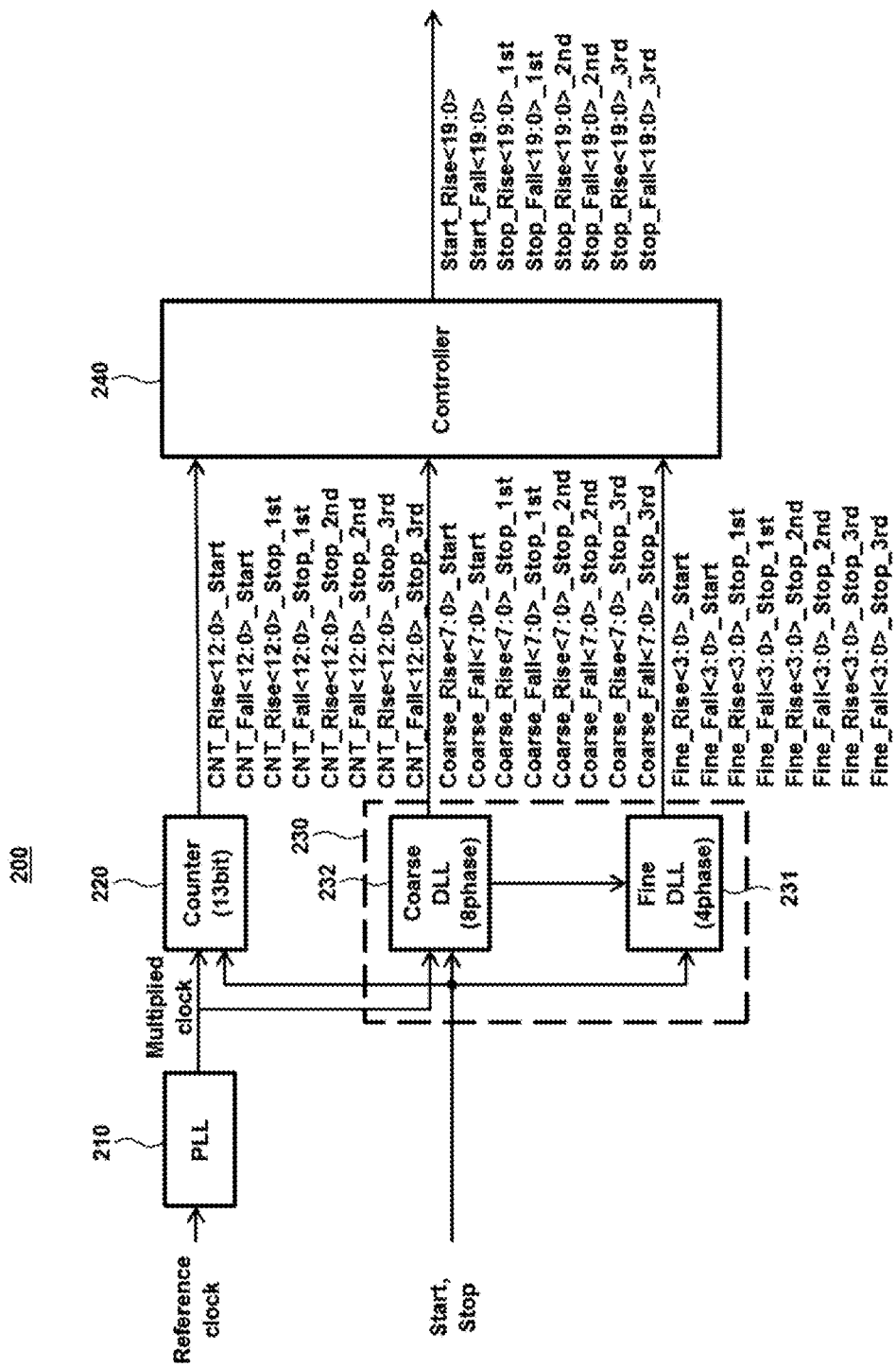
FIG. 4 is a block diagram illustrating the configuration of a time-to-digital converter in a LIDAR system in one form of the present disclosure.

FIG. 4 is a block diagram illustrating the configuration of a time-to-digital converter in a LIDAR system in some forms of the present disclosure.

As illustrated in FIG. 4, the time-to-digital converter 200 in the LIDAR system in some forms of the present disclosure includes a phase locked loop unit 210, a counting unit 220, and a delay locked loop unit 230, and a control unit 240. However, all illustrated components are not required components. The time-to-digital converter 200 may be implemented by components more than the illustrated components and the time-to-digital converter 200 may be implemented by smaller components therethan.

As an example, the time-to-digital converter 200 generates a fast frequency by multiplying the reference clock by 25 and stores a coefficient for the edge of an input pulse using the counter. Here, the coefficient is stored for each of the rising and falling edges (CNT_Rise/Fall).

The time-to-digital converter 200 divides the fast frequency into 8 phases and records an edge position of the input pulse. Here, the edge position is recorded every a maximum of three rising and falling edges (Coare_Rise/Fall).

The time-to-digital converter 200 divides 8 phases into 4 phases again and records the edge position of the input pulse. Here, the edge position is recorded every a maximum of three rising and falling edges (Fine_Rise/Fall).

The time-to-digital converter 200 sums and outputs final data.

Hereinafter, a detailed configuration and a detailed operation of each of the components of the time-to-digital converter 200 of FIG. 4 will be described.

The phase locked loop unit 210 multiplies the input reference clock by using the phase locked loop (PLL).

The counting unit 220 counts the reference clock multiplied by the phase-locked loop unit 210 and records the edge position of the input signal.

The delay locked loop unit 230 decomposes the reference clock multiplied by the phase locked loop unit 210 into a multi-phase clock using the delay locked loop (DLL), and senses an edge position part of the input signal recorded by the counting unit 220 among the decomposed multi-phase clocks and records a fine edge position.

The control unit 240 calculates a time difference in time of flight (ToF) between the start signal and the stop signal of the input signal by using the edge position recorded in the counting unit 220 and the fine edge position recorded in the delay locked loop unit 230.

According to exemplary embodiments, the edge position and the fine edge position may be recorded for each of the rising edge and the falling edge of the input signal.

According to exemplary embodiments, the delay locked loop unit 230 may include a first delay locked loop unit 231 that decomposes the multiplied reference clock into a first multi-phase clock using a first delay locked loop and a second delay locked loop unit 232 that decomposes the decomposed first multi-phase clock into a second multi-phase clock by using a second delay locked loop.

According to exemplary embodiments, the delay locked loop unit 230 may sense the edge position part of the input signal recorded in the counting unit 220 among the decomposed multi-phase clocks and record a first fine edge position and sense the first fine edge position part recorded among the decomposed second multi-phase clocks and record the second fine edge position.

According to exemplary embodiments, the control unit 240 may expand the channel of the stop signal of the input signal when the input signal is configured by a multi-channel input signal.

According to exemplary embodiments, the control unit 240 may check a signal intensity of the input signal, distinguish a target object by using the checked signal intensity, and correct a distance error from the target object by using the checked signal intensity.

According to exemplary embodiments, when light transmitted to the target object is reflected by a subject, the control unit 240 may remove noise information corresponding to the reflected light by using pulse width and transition time information.

As such, the time-to-digital converter 200 mixes the phase locked loop and the delay locked loop to perform a time-to-digital converting operation.

The time-to-digital converter 200 performs a time-to-digital converting operation with high resolution by using the multi-phases of the delay locked loop.

The time-to-digital converter 200 performs a time-to-digital converting operation with a range of a wide time area by counting the output of the phase locked loop.

The time-to-digital converter 200 performs a time-to-digital converting operation so as to have the high resolution by using the output of the phase locked loop as the input of the delay locked loop.

The time-to-digital converter 200 performs a time-to-digital converting operation with high expandability by implementing multiple channels.

The time-to-digital converter 200 may enhance the precision by sensing both the rising edge and the falling edge of the input pulse.

Figure 5:
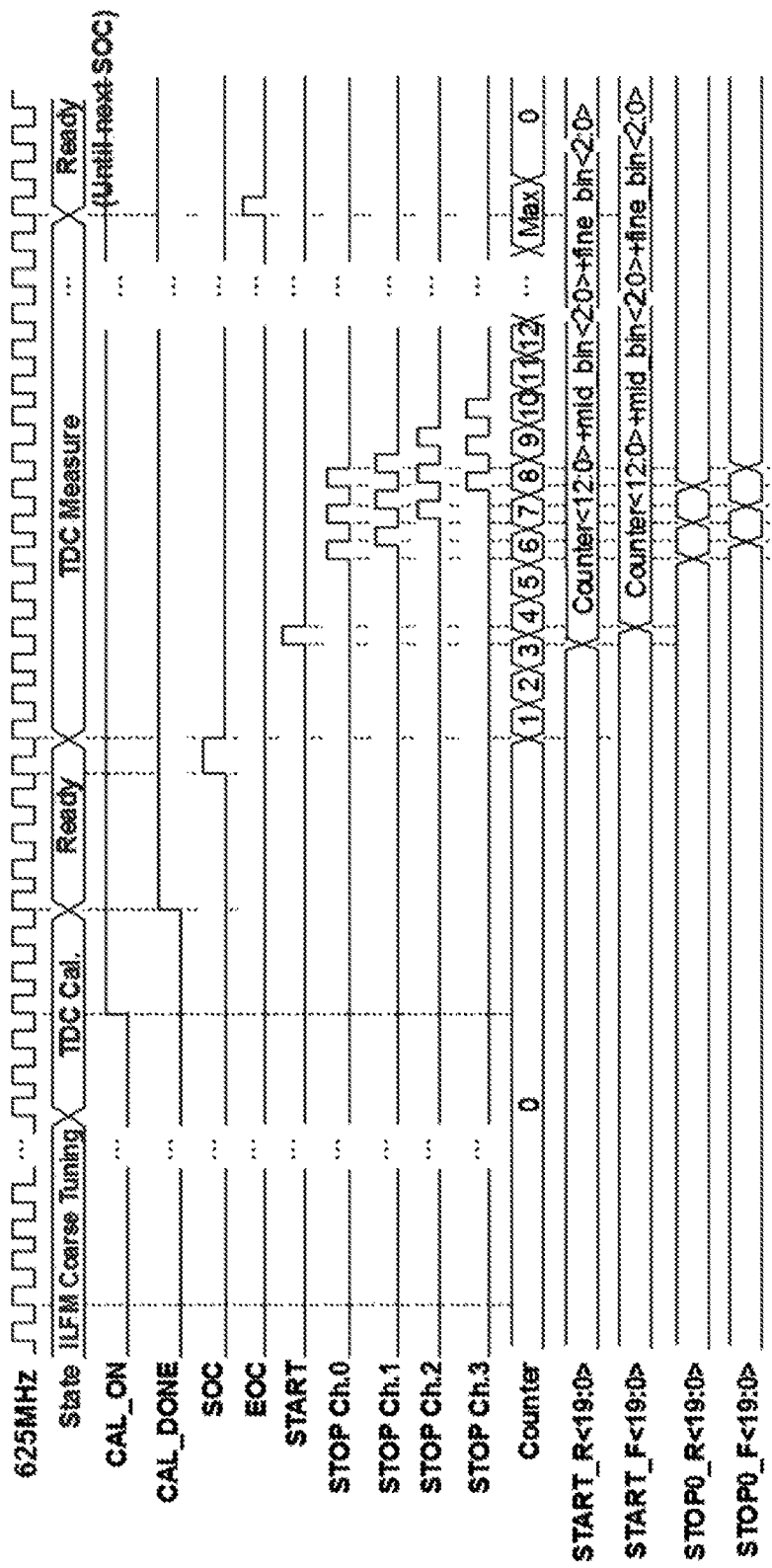
FIG. 5 is a diagram illustrating an operation timing of a time-to-digital converter in one form of the present disclosure.

FIG. 5 is a diagram illustrating an operation timing of a time-to-digital converter in some forms of the present disclosure.

As illustrated in FIG. 5, when the PLL and the DLL are in a ready state, the control unit 240 outputs a Start of Calculation (SOC).

The control unit 240 outputs an End of Calculation (EOC) signal after a predetermined time.

The control unit 240 calculates data of each edge when the START signal and the STOP signal enter after the SOC.

The control unit 240 counts a fast frequency (e.g., 625 MHz, 1.6 ns) and stores each counter value at which the edge of the input pulse enters.

In the DLL, rise/fall information for #3 (#1 starts) of the input pulse is stored for each channel.

The control unit 240 sums and outputs the final data.

Figure 6:
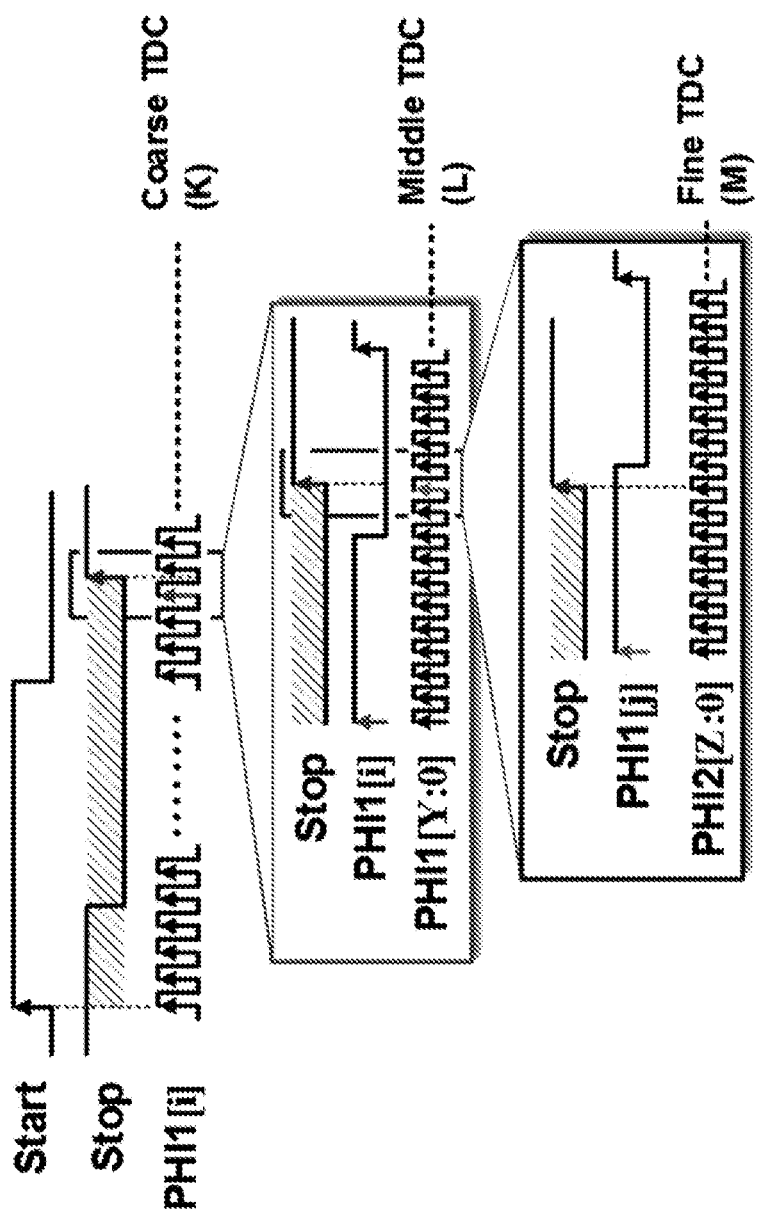
FIGS. 6 and 7 are diagrams illustrating a 3-stage TDC operation timing of a time-to-digital converter in one form of the present disclosure.
Figure 7:
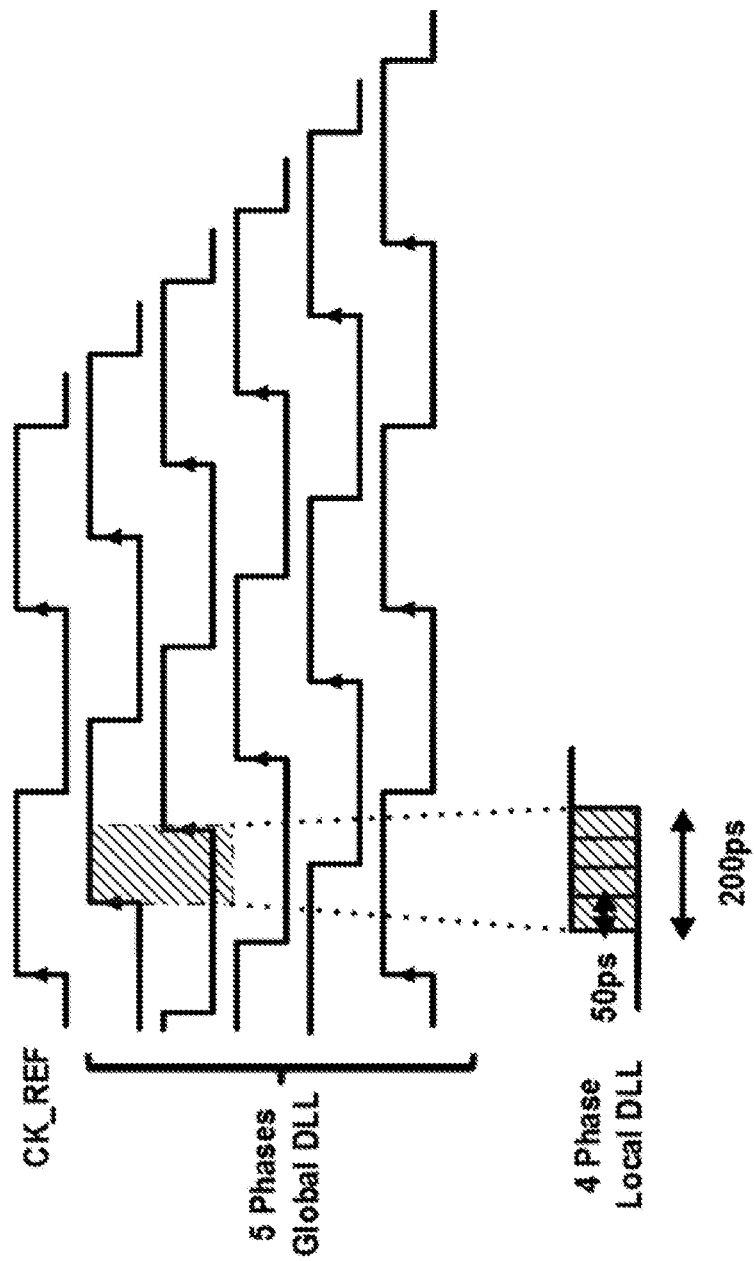

FIGS. 6 and 7 are diagrams illustrating a 3-stage TDC operation timing of a time-to-digital converter in some forms of the present disclosure.

As illustrated in FIGS. 6 and 7, the time-to-digital converter 200 detects a time between start and stop through low power and high resolution 3-step time-to-digital conversion.

The time-to-digital converter 200 detects a primary coarse edge through the PLL/counter. The time-to-digital converter 200 detects a secondary middle edge through C-ADDLL. The time-to-digital converter 200 detects a ternary fine edge through F-ADDLL.

Figure 8:
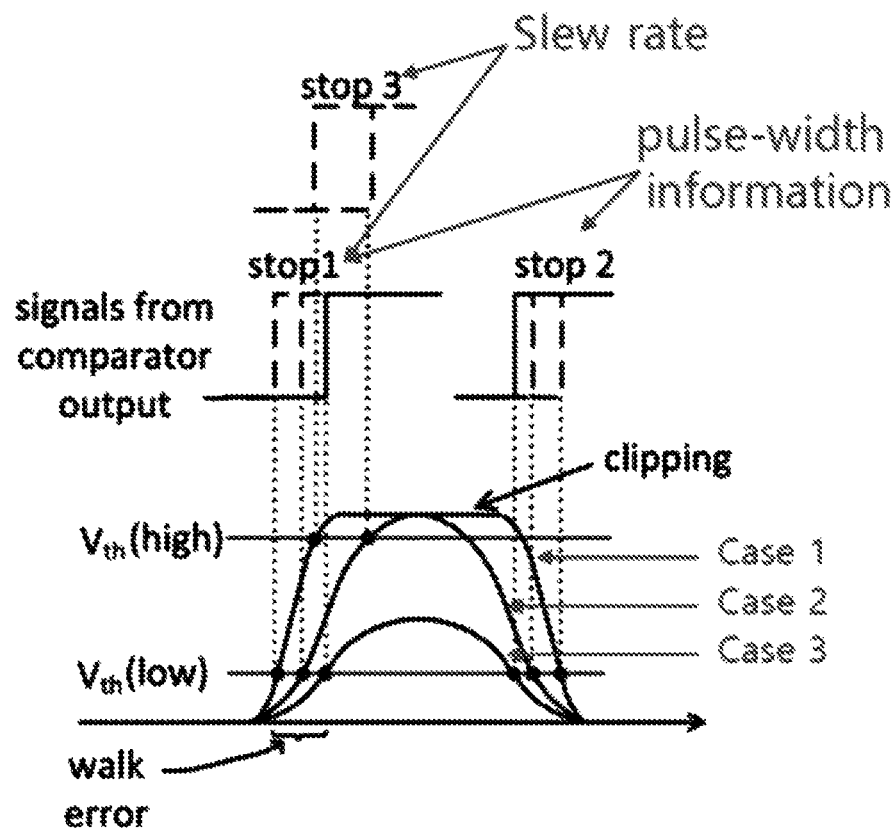
FIG. 8 is a diagram illustrating noise generated in a LIDAR system.

FIG. 8 is a diagram illustrating noise generated in a LIDAR system.

In some forms of the present disclosure, a walk error generated in the LIDAR system illustrated in FIG. 8 may be improved. In some forms of the present disclosure, in the case where the position of the edge may not be accurately determined when a transition time of the input signal is long, an intermediate value between rising data and falling data may be corrected using data.

Meanwhile, a method for processing a distance detection error signal of the LIDAR system will be described.

Figure 9:
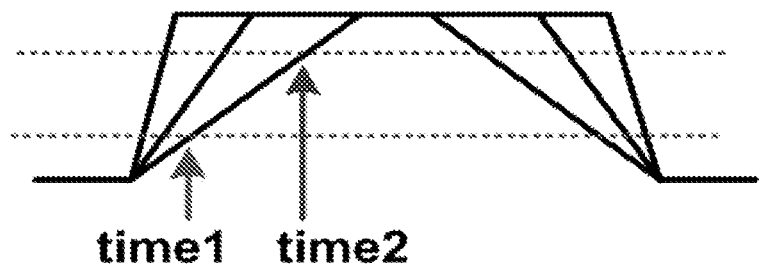
FIG. 9 is a diagram illustrating a transition time of a signal.

FIG. 9 is a diagram illustrating a transition time of a signal.

The TOF of the LIDAR outputs time data of the edge in a signal amplifier and the TDC.

In a general LIDAR, the rising/falling and pulse width of a received signal may vary depending on the distance and a reflection degree.

The time-to-digital converter 200 in some forms of the present disclosure may identify the intensity of the signal, classify object information, and correct a distance error.

The time-to-digital converter 200 amplifies the signal based on a specific threshold point in a signal amplification stage. The time-to-digital converter 200 extracts time information by varying threshold voltage for the same signal. By comparing the difference between the two time information, it is possible to know the transition time of the signal. The time-to-digital converter 200 detects the intensity of the signal by using transition information.

When the light is strong, the signal transition is fast, and when the light is weak, the transition is slow. The intensity of the light at the same distance may be used to determine the state of the object. For example, the reflection degree of the light may be used to separate a boundary of a white color and a black color. A road surface in front of a moving vehicle has white lanes and black lanes. Even with the same distance information, since the reflection degree is different, it is possible to detect the distance and identify lanes at the same time.

For example, a vehicle made of metal and a person wearing clothes have different degrees of light reflection. Therefore, when detecting a danger, when the vehicle and the person are separately determined, a personal accident may be avoided.

Figure 10:
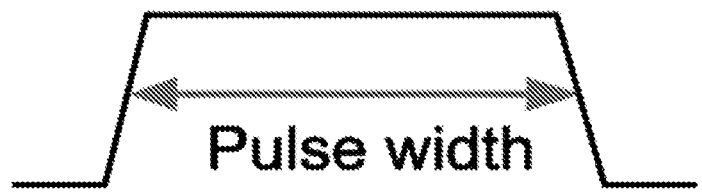
FIG. 10 is a diagram illustrating a pulse width calculation operation using rising and falling edge time information.

FIG. 10 is a diagram illustrating a pulse width calculation operation using rising and falling edge time information.

The time-to-digital converter 200 may calculate the pulse width by using the rising and falling edge time information.

The intensity of the light returns differently depending on the distance and the pulse width varies. The time-to-digital converter 200 may correct the error of distance information by using pulse width information. The time-to-digital converter 200 may compare the received pulse width information with a previously created lookup table and use the compared information for final distance information correction.

Figure 11:
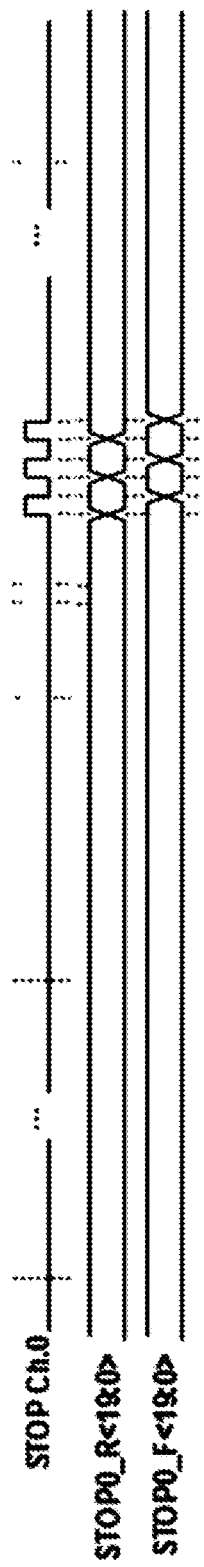
FIG. 11 is a diagram illustrating an operation of storing edge information of pulses entering within a distance information detection time.

FIG. 11 is a diagram illustrating an operation of storing edge information of pulses entering within a distance information detection time.

In a real situation, the light may be reflected by subjects such as dust, snow, or rain. Presented is a method for distinguishing an actual object and the noise in such a noisy situation.

A time when the LIDAR detects the distance information is up to a time during which the light is transmitted to an LD and returned. In order to detect a distance of 200 m, it should be possible to detect the distance for a time of approximately 1.5 μs.

A TOF pulse input for the time of 1.5 μs includes information on the object and information on the noise.

If the time information is stored only once, when a noisy object is closer than the actual object, there is a problem in that the distance to the actual object may not be determined.

To solve this, the time-to-digital converter 200 may store all edge information of pulses that come within the distance information detection time, and remove the noise using the pulse width and transition time information.

Figure 12:
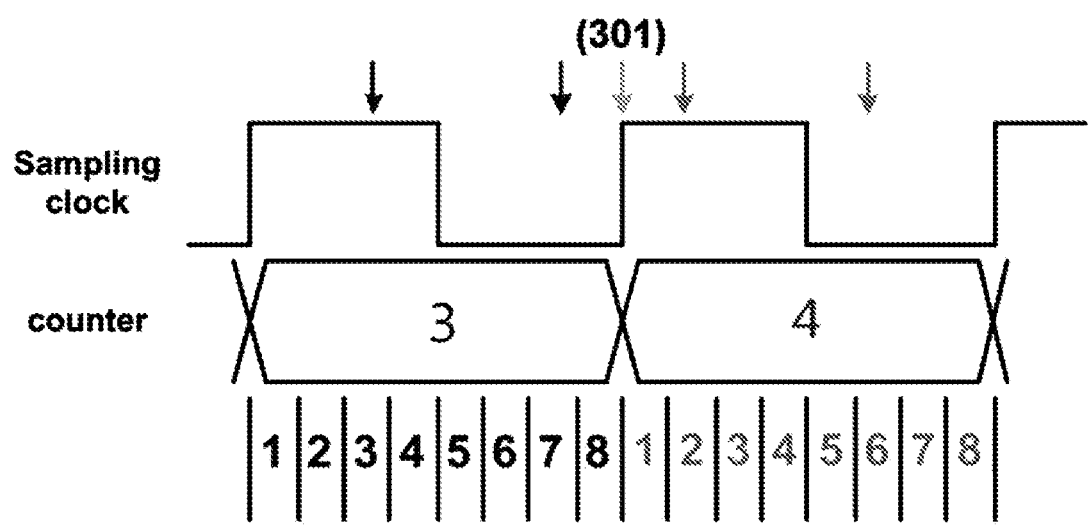
FIG. 12 is a diagram illustrating an operation of sampling a signal coming on a rising edge of a sampling clock to a falling edge.

FIG. 12 is a diagram illustrating an operation of sampling a signal coming on a rising edge of a sampling clock to a falling edge.

In the LIDAR system, the edge of the TOF pulse is input as an asynchronous signal regardless of an internal sampling clock.

TDC, which uses a counter, uses a sampling clock with a predetermined period, but the TOF pulse that is input at a sampling timing edge may not output an accurate counter result.

This may cause a counter 1-bit error, and an error of 20 cm or more occurs during LIDAR distance detection.

In some forms of the present disclosure, a method for retiming the input pulse in the TDC using the multi-phases by using the DLL is used.

The time-to-digital converter 200 uses a structure in which a signal coming on the rising edge of the sampling clock is sampled with the falling edge when retiming the input pulse using the sampling clock.

For example, as illustrated in FIG. 12, at a red position 301, the result should have a value of 3/8 or 4/1.

If the counter value is recognized as 3 and the multi-phase value is recognized as 1, a result of 3/1 is obtained.

On the contrary, a result of 4/8 may be obtained.

In the time-to-digital converter 200 in some forms of the present disclosure, when an input edge enters a position of '1' or '8' of an 8-phase multi-phase, the counter value is stored by falling of the sampling clock. Thereafter, when the counter value is '1', the counter value is maintained and when the counter value is '8', the time-to-digital converter 200 stores a value acquired by subtracting 1 from the counter value.

When such a method for preventing a metastability sampling error is used, a distance detection error may be solved.

Figure 13:
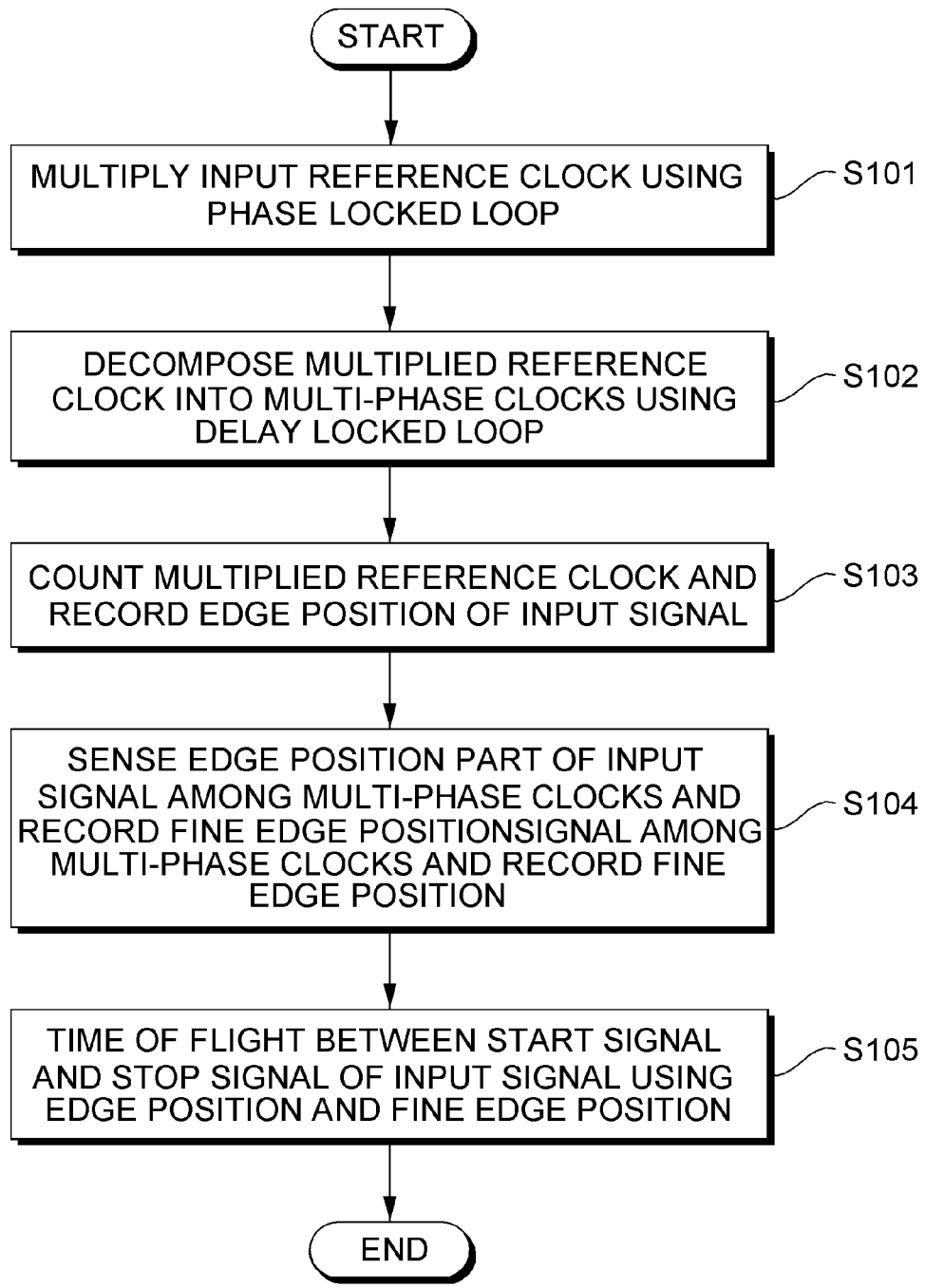
FIG. 13 is a flowchart for a time-digital converting method in a LIDAR system in one form of the present disclosure.

FIG. 13 is a flowchart for a time-digital converting method in a LIDAR system in some forms of the present disclosure.

In step S101, the time-to-digital converter 200 multiplies the input reference clock by using the phase locked loop (PLL).

In step S102, the time-to-digital converter 200 decomposes the reference clock multiplied by the phase locked loop unit 210 to the multi-phase clock by using the delay locked loop (DLL).

In step S103, the time-to-digital converter 200 counts the reference clock multiplied by the phase-locked loop unit 210 and records the edge position of the input signal.

In step S104, the time-to-digital converter 200 senses an edge position part of the input signal recorded in the counting unit 220 among the decomposed multi-phase clocks and records a fine edge position.

In step S105, the time-to-digital converter 200 calculates a time difference in time of flight (ToF) between the start signal and the stop signal of the input signal by using the edge position recorded in the counting unit 220 and the fine edge position recorded in the delay locked loop unit 230.

Meanwhile, in some forms of the present disclosure, a high-resolution time-to-digital converter 200 and a high-resolution time-to-digital converting method using multi-phases can be provided. For example, the time-to-digital converter 200 may have high-resolution performance of 50 ps and this may have high-precision distance detection performance of 0.75 cm.

The phase locked loop (PLL) and the delay locked loop (DLL) used in some forms of the present disclosure as feedback systems show robust characteristics to the external environment. Here, the external environment may include changes in temperature and power voltage, a change in manufacturing process, and the like.

In the time-to-digital converter 200 in some forms of the present disclosure, the phase clocked loop (PLL) is commonly used and the delay locked loop (DLL) is configured by the channel, and as a result, it is easy to expand the channel using a small area. This may reduce system cost.

In some forms of the present disclosure, the time-to-digital converter 200 may enhance a detection capability for a signal at a long distance with the same resolution by using a counter. For example, up to approximately 1.62 μs may be detected and the distance approximately 246 m. This has an advantage that by dividing a measurement range into two, coarse and fine, the counter value need not largely increase for long distance measurement of the vehicle which moves by 50 m or more per second.

The time-to-digital converter 200 in some forms of the present disclosure may enhance the precision by sensing both the rising edge and the falling edge of the pulse. Noise (walk error) generated in the LIDAR system may be improved In the case where the position of the edge may not be accurately determined when the transition time of the input signal is long, the position of the edge may be corrected by using an intermediate value between rising data and falling data as data.

Meanwhile, the embodiments according to the present disclosure may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary embodiments have been described and illustrated in the drawings and the specification. The exemplary embodiments were chosen and described in order to explain certain principles of the disclosure and their practical application, to thereby enable others skilled in the art to make and utilize various exemplary embodiments of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the disclosure are deemed to be covered by the disclosure which is limited only by the claims which follow.

What is claimed is:

1. A time-to-digital converter comprising:
a phase locked loop unit configured to multiply an input reference clock by using a phase locked loop (PLL);
a counting unit configured to:
count the multiplied input reference clock; and
record an edge position of an input signal;
a delay locked loop unit configured to:
decompose the multiplied input reference clock into a multi-phase clock using a delay locked loop (DLL);
sense the recorded edge position of the input signal among the decomposed multi-phase clocks; and
record a fine edge position; and
a control unit configured to calculate a time difference in time of flight (ToF) between a start signal of the input signal and a stop signal of the input signal by using the recorded edge position and the recorded fine edge position.

2. The time-to-digital converter of claim 1, wherein:
the counting unit is configured to record the edge position for each of a rising edge and a falling edge of the input signal, and
the delay locked loop unit is configured to record the fine edge position for each of the rising edge and the falling edge of the input signal.

3. The time-to-digital converter of claim 1, wherein the delay locked loop unit further comprises:
  a first delay locked loop unit configured to decompose the multiplied input reference clock into a first multi-phase clock by using a first delay locked loop; and
  a second delay locked loop unit configured to decompose the decomposed first multi-phase clock into a second multi-phase clock by using a second delay locked loop.

4. The time-to-digital converter of claim 2, wherein the delay locked loop unit is configured to:
  sense the edge position of the input signal among the multi-phase clock and record a first fine edge position; and
  sense the recorded first fine edge position among the decomposed second multi-phase clock and record a second fine edge position.

5. The time-to-digital converter of claim 1, wherein, when the input signal is a multi-channel input signal, the control unit is configured to expand a channel of the stop signal of the input signal.

6. The time-to-digital converter of claim 1, wherein the control unit is configured to:
  check a signal intensity of the input signal;
  distinguish a target object by using the checked signal intensity; and
  correct a distance error from the target object by using the checked signal intensity.

7. The time-to-digital converter of claim 6, wherein, when light transmitted to the target object is reflected by a subject, the control unit is configured to remove noise information corresponding to the reflected light by using pulse width and transition time information.

8. A time-to-digital converting method in a light detection and ranging (LIDAR) system, the method comprising:
  multiplying, by a phase locked loop unit, an input reference clock by using a phase locked loop (PLL);
  decomposing, by a delayed locked loop unit, the multiplied input reference clock into multi-phase clocks by using a delay locked loop (DLL);
  counting, by a counting unit, the multiplied input reference clock and recording an edge position of an input signal;
  sensing, by the delayed locked loop unit, the edge position of the input signal among the decomposed multi-phase clocks and recording a fine edge position; and
  calculating, by a control unit, a time difference in time of flight (ToF) between a start signal of the input signal and a stop signal of the input signal by using the edge position and the fine edge position.

9. The method of claim 8, wherein the method further comprises:
  recording, by the counting unit, the edge position for each of a rising edge and a falling edge of the input signal; and
  recording, by the delay locked loop unit, the fine edge position for each of the rising edge and the falling edge of the input signal.

10. The method of claim 8, wherein recording the fine edge position comprises:
  decomposing, by a first delay locked loop unit, the multiplied input reference clock into a first multi-phase clock by using a first delay locked loop; and
  decomposing, by a second delay locked loop unit, the decomposed first multi-phase clock into a second multi-phase clock by using a second delay locked loop.

11. The method of claim 8, wherein recording the fine edge position comprises:
  sensing the edge position of the input signal among the multi-phase clock and recording a first fine edge position; and
  sensing the recorded first fine edge position among the decomposed second multi-phase clock and recording a second fine edge position.

12. The method of claim 8, wherein calculating the difference in time of flight comprises:
  checking a signal intensity of the input signal;
  distinguishing a target object by using the checked signal intensity; and
  correcting a distance error from the target object by using the checked signal intensity.

13. The method of claim 8, wherein calculating the difference in time of flight comprises:
  when light transmitted to the target object is reflected by a subject, removing noise information corresponding to the reflected light by using pulse width and transition time information.

* * * * *